Oct. 14, 1969 J. H. KISER 3,473,128

AUTOMATIC GANGING OF SUPERHETERODYNE RADIO FREQUENCY STAGES

Filed Dec. 20, 1966 2 Sheets-Sheet 1

INVENTOR
Joseph H. Kiser
BY Rendine, Neill, Schottler & Wikstrom
ATTORNEYS.

INVENTOR
Joseph H. Kiser
BY Sandoe, Hill, Schotter & Wilkinson
ATTORNEYS.

United States Patent Office 3,473,128

Patented Oct. 14, 1969

3,473,128

AUTOMATIC GANGING OF SUPERHETERODYNE RADIO FREQUENCY STAGES

Joseph H. Kiser, Stamford, Conn., assignor to Vari-L Company, Inc., Stamford, Conn., a corporation of Connecticut Filed Dec. 20, 1966, Ser. No. 603,235

Int. Cl. H04b *1/26*

U.S. Cl. 325—422 8 Claims

ABSTRACT OF THE DISCLOSURE

The tuned radio frequency stages of a superheterodyne type of radio receiver have formerly been ganged mechanically with the local oscillator tuning, but in this invention one or more electrically variable reactances are used to perform the radio-frequency tuning function in a manner that makes no mechanical connection necessary. The system senses and corrects for receiver mistuning by supplying identical correction commands simultaneously to any number of electrically tuned radio frequency stages having similar characteristics; for example, tuning circuits for the antenna, RF amplifier, or preselector stages, and frequency converter or mixer input stages. The correction signal is taken from the IF circuit through a limiter and discriminator to a tuning network.

BRIEF DESCRIPTION OF THE INVENTION

This invention is a system for automatically ganging the tuned radio frequency stages of a radio receiver, which utilize electrically variable reactances for tuning, to the tuning of a variable frequency oscillator which can be the local oscillator of the receiver.

The superheterodyne type of radio receiver has found wide acceptance in modern communications. This receiving system is improved if it has stages of radio frequency selectively ahead of the frequency converter stage to eliminate spurious responses or images, to improve the signal-to-noise ratio, and to improve the sensitivity of the receiver to weak signals.

Traditionally, these tuned radio frequency stages have been ganged with the local oscillator tuning by mechanical means. Such systems are always a compromise between the cost per stage and the degree of tracking accuracy obtainable. Since the various stages are mechanically coupled, they have the disadvantage that they must be located in close proximity to each other and in close proximity to the rest of the receiver.

This invention embodies one or several electrically variable reactances which are caused to perform the radio frequency tuning function in such a receiving system without mechanical connection to the tuned variable frequency oscillator.

The devices for which this invention is useful are any of those wherein their impedance to the flow of current through them (at radio frequency AC), is controlled by a separate and distinct control voltage or current.

With modern production methods, it is feasible to make groups of units which have nearly identical electrical characteristics and it follows that the inherent errors of such devices due to temperature drift, hysteresis or creepage, will also be similar.

Therefore, a system which will sense and correct for RF amplifier mistuning, can supply an identical correction command simultaneously to any number of similar electrically tuned stages, as for example, several electrically variable inductors tuning simultaneously the antenna, RF amplifier or preselector stages, and the frequency converter or mixer input stages of a superheterodyne radio receiver system.

A receiver using this invention has an ability to withstand environmental conditions more severe than those in which mechanically ganged equivalent systems can be used. This is because the present invention uses sealed, non-mechanical components to accomplish the tuning of the active or passive tuned radio frequency circuits or networks.

Other objects, features and advantages of the invention will appear or be pointed out as the description proceeds.

BRIEF DESCRIPTION OF THE DRAWINGS

In the drawing, forming a part hereof, in which like reference characters indicate corresponding parts in all the views.

Figure 1:
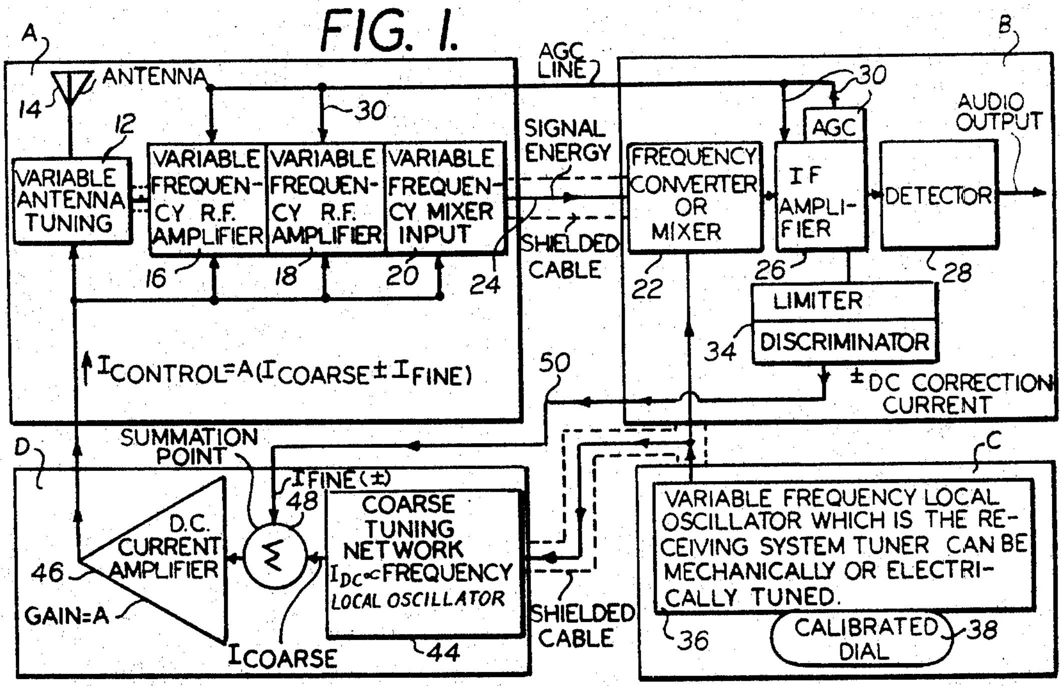
FIGURE 1 is a block diagram showing the relations of the different parts of a radio receiver made in accordance with this invention.

Block (A) consists of the radio frequency preselection and/or amplification of the system. It includes tuning for some or all of the following stages:

(1) Antenna loading, matching, or tuning;
(2) RF amplifier or preselector tuning;
(3) Frequency converter signal input tuning;
(4) The tuning of any other signal frequency, selective network, such as a tracking band pass filter;
(5) The tuning of all or part or any combination of the above.

Block (A) includes a variable antenna tuning device 12 connected with an antenna 14. The signal from the tuning device 12 is supplied to first and second stage variable frequency RF amplifiers 16 and 18, respectively; and from the second stage amplifier 18 the signal is supplied to a variable frequency mixer input 20 connected with a frequency converter or mixer 22 by a shielded cable 24.

Block (B) consists of one or more frequency converters, like the frequency converter or mixer 22, and one or more associated intermediate frequency filters and amplifiers 26 along with a standard amplitude modulation detector 28 and standard automatic gain control circuitry 30. In addition, a limiter 33 and frequency discriminator 34 are driven from the IF amplifier 26. Block (B) is not meant to be in any way unique except that a limiter and frequency discriminator has been added.

The term "frequency discriminator" or "limiter discriminator" in this context means any network such that its output will be a positive or negative DC voltage proportional to the signal frequency detuning from the center frequency to which the network is tuned, independent of signal amplitude or amplitude variations. Then in this case the above described network, termed "limiter discriminator," is tuned to the IF frequency and when the entering signal is precisely at the IF frequency, the network is nulled and delivers approximately no DC output.

Block (C) consists of a variable frequency oscillator. This oscillator may be continuously variable such as a tuned LC or RC circuit, or it may be variable in discrete steps such as a switched crystal oscillator or frequency synthesizer. It is preferably equipped with a calibrated dial 38.

Block (D) consists of a coarse tuning network 44 which delivers a DC output current proportional to frequency. This network 44 is designed such that as the oscillator 36 has its frequency varied, the DC output current from this network 44 corresponds to the characteristic curve of the electrically variable inductances of the units 12, 16, 18 and 20 so that, after current amplification by an amplifier 46 shown in Block (D), the electrically variable RF circuits of Block (A) are tuned coarsely to the signal input frequency of Block (B). Before current amplification by amplifier 46, however, the output from this network 44 is summed by comparator 48 with the output from discriminator 34 in Block (B). A cable 50 connects the discriminator 34 with the comparator 48. The term "signal" is used in a broad sense to include a radio frequency signal, or noise incident on the antenna, and noise generated within the radio frequency stages.

It will be understood that alternate coarse tuning schemes will give satisfactory results. For example, it is possible to use a mechanically variable resistor 54 (FIGURE 2) in place of the network 44 and to mechanically gang the variable oscillator shaft 56 of oscillator 36 to resistor 54. By a proper choice of the characteristics of resistor 54, a DC proportional to shaft movement (and hence OSC frequency), can be achieved. Otherwise, blocks (C′) and (D′) are the same as blocks (C) and (D) of FIGURE 1.

This invention can, in fact, include any number of said coarse tuning networks or mechanisms which collectively or separately, or in any combination, will cause the desired coarse tuning behavior to the system as a function of the tuning of the oscillator 36.

The operation of the control system of this invention proceeds as follows:

Assume first that it is desired to receive a signal that is located above the frequency to which the system is tuned at the start of the tuning process. The mechanically variable oscillator 36 is tuned upward, causing a rise in the frequency to which the receiver in Block (B) is tuned. Further, this tuning of the oscillator 36 causes an increase in the output current from the network 44 which is amplified by the amplifier 46 in Block (D). This current, in turn, is the control current which is used to tune the electrically variable tuned circuits in the RF units 12, 16, 18 and 20 of Block (A). Hence these RF units 12, 16, 18 and 20 are tuned upward toward the signal, within the limits of accuracy established by the coarse tuning network, along with the rest of the system. Since the RF units are only coarsely aligned or ganged with the Block (B) receiver input frequency, the following two combinations of events are possible anytime between the time at which the tuning process is started and the time when the system is perfectly tuned to the input signal:

(1) Block (A) RF units below the appropriate frequency. Block (B) receiver below the desired signal frequency.

(2) Block (A) RF units above the appropriate frequency. Block (B) receiver below the desired signal frequency.

Figures 3, 4A, 4B, 5:
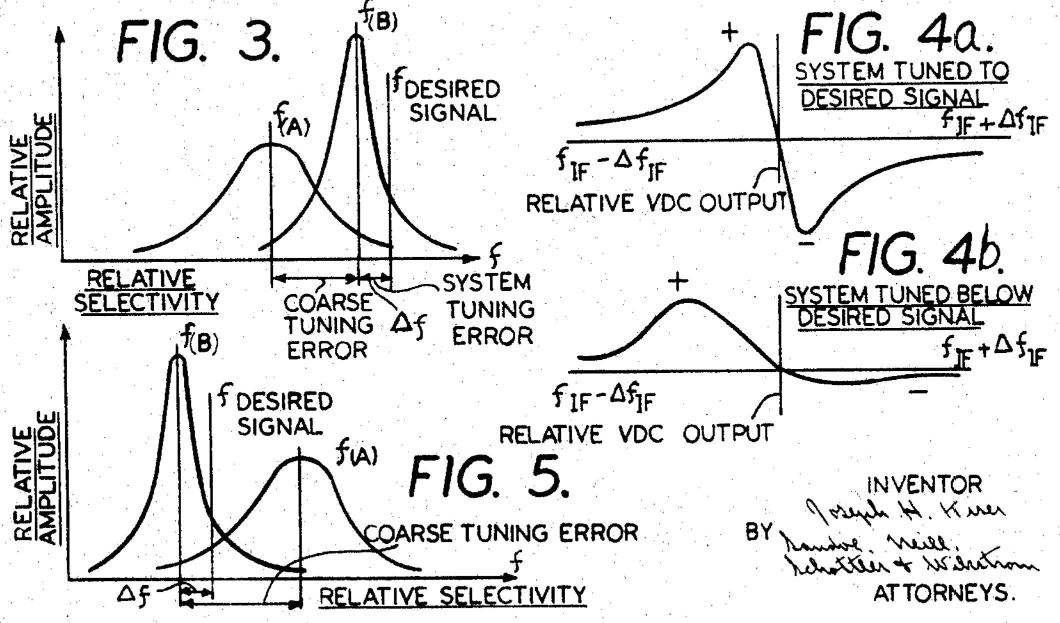
FIGURES 3, 4*a*, 4*b*, 5, 6*a* and 6*b* are graphs showing conditions in the circuits at various times during a tuning process.

First, condition (1) will be discussed. As the system is tuned toward the desired signal, an instantaneous picture of the relative passbands of the RF amplifiers 16 or 18 of Block (A) and the receiver of Block (B), as shown in FIGURE 3, will be a useful analysis aid. In FIGURE 3 the curve that reaches its maximum at the frequency designated $f(A)$ represents the passband of the Block (A) and similarly the curve that reaches its maximum at the frequency designated $f(B)$ represents the passband of the Block (B). These passbands change their positions along the frequency axis with change of tuning of the blocks as shown in FIGURES *5a*, *8a* and *8b*. As the tuning process proceeds toward the desired signal, the signal is caused to fall somewhere in the passband of both Blocks (A) and (B), as shown in FIGURE 3. When this occurs, the signal is translated by frequency conversion to an IF frequency and amplified.

The translated or IF frequency appearing at the input to the limiter discriminator 34 has components predominantly corresponding to the mistuning of the system and hence the output from the IF amplifier will be at $f_{IF}-\Delta f_{IF}$. This output from the IF amplifier of Block (B) is limited in amplitude by the limiter in Block (B) and the limited output is applied to the discriminator 34. The discriminator supplies a DC output voltage of positive sign directly proportional to the $f_{IF}-\Delta f_{IF}$ frequency applied to its input.

At this point in the turning process, a further analysis aid is an instantaneous picture of the discriminator's characteristic curve. FIGURE *4a* depicts the instantaneous discriminator characteristic for perfect system tuning and FIGURE *4b* shows the characteristic when the system is not yet tuned up, as assumed so far in this discussion. From FIGURE *4b* it is apparent that under the assumed conditions in the system tuning-up process, the discriminator's characteristic is non-symmetrical. This is due to the fact that the discriminator is preceded by a high gain receiver which acts as a filter and at this point in time passes only frequencies corresponding to $f_{IF}-\Delta f_{IF}$, and hence the system is insensitive to signals above and below the desired system input signal. Therefore the Block (A) RF amplifiers 16 and 18 will not be detuned falsely by a strong signal located either above or below the desired signal. This is a further advantage of the invention.

The DC output from the discriminator 34 in Block (B) is the fine tuning DC and is summed with the output of the coarse tuning network 44 in Block (D) whereupon it is DC amplified by amplifier 46 in Block (D) with the coarse control current to yield a total current of $(I_{coarse}+I_{fine})$ which is then amplified by the amplifier 46 to correct the RF amplifier tuning. Hence the RF amplifiers 16 and 18 of Block (A) are caused to be tuned to the frequency of Block (B), and Blocks (A) and (B) are effectively gang-tuned together. As the oscillator 36 of Block (C) is tuned upward, the system is tuned nearer the desired input signal frequency by a dynamic succession of automatic system adjustments, as just described.

When the system is very nearly tuned up to the input signal frequency, the output of the discriminator 34 of Block (B) begins to approach zero DC output, as pictured in FIGURE *4a*. However, as the system does indeed approach optimum tuning, the entire system becomes a very high gain selective amplifier because of proper tuning and ganging and, therefore, the slope of the discriminator's characteristic curve tends to become very steep, as shown in FIGURE *4a*. Using the desired input signal as a reference, optimum system tuning or, conversely, minimum system tuning error, is a function of the slope of the discriminator's output characteristic, which, in turn, depends directly on the sensitivity and selectivity of the receiver or amplifiers preceding the discriminator to pass only the reference signal.

As the sensitivity of the Block (A) and Block (B)

receiver or amplifiers approaches infinity, so also the slope of the instantaneous discriminator characteristic approaches infinity or a straight, nearly vertical line. This means that for very small system tuning errors, a large correction current is transmitted to tune up the circuits of the Block (A) RF units 12, 16, 18 and 20. Then with the system properly tuned, the stability of the system (assuming a stable, or fixed IF amplifier 26), is effectively dependent only upon the stability of the reference or local oscillator 36, since detuning errors occurring in the Block (A) tuned RF circuits for any reason will be compensated for dynamically in a feedback loop fashion, as described.

Viewing the tuning-up process from the second condition, i.e., (2), Block (B), receiver, tuned below the desired input signal and the Block (A), tuned RF circuits, tuned above the desired input signals, leads to the following system tuning analysis:

As the frequency of the oscillator 36 of Block (C) is increased, it causes the receiver of Block (B) to tune toward the desired input signal. At the same time, the output of the Block (C) oscillator is applied to the coarse tuning network 44 of Block (D), which supplies a DC current which is DC-amplified in Block (D), and is then applied to the electrically tuned RF stages as the coarse control DC tuning current. Hence, the Block (B) receiver is tuned toward the desired signal and the Block (A) RF amplifiers 16 and 18 tune along simultaneously per condition (2), that is, slightly above the frequency to which Block (B) is tuned. This difference $f_{\text{Block (A)}}-f_{\text{Block (B)}}$, the coarse tuning error, is established by the limits of accuracy of the coarse tuning network 44. Once again, at some point in this process the desired signal will fall within the passband of both Blocks (A) and (B). This is illustrated in FIGURE 5. The IF amplifiers 26 will again be caused to amplify components predominantly corresponding to the system mistuning at $f_{IF}-\Delta f_{IF}$. However, since the RF amplifiers of Block (A) are tuned to above the desired signal, the components coming through Block (B) are very low in magnitude and hence the discriminator 36 puts out negligible positive correction current. This is explained as before by looking at the instantaneous discriminator curve (FIGURES 6*a* and 6*b*) under the conditions set forth.

Figures 6A, 6B, 7, 8A, 8B, 9:
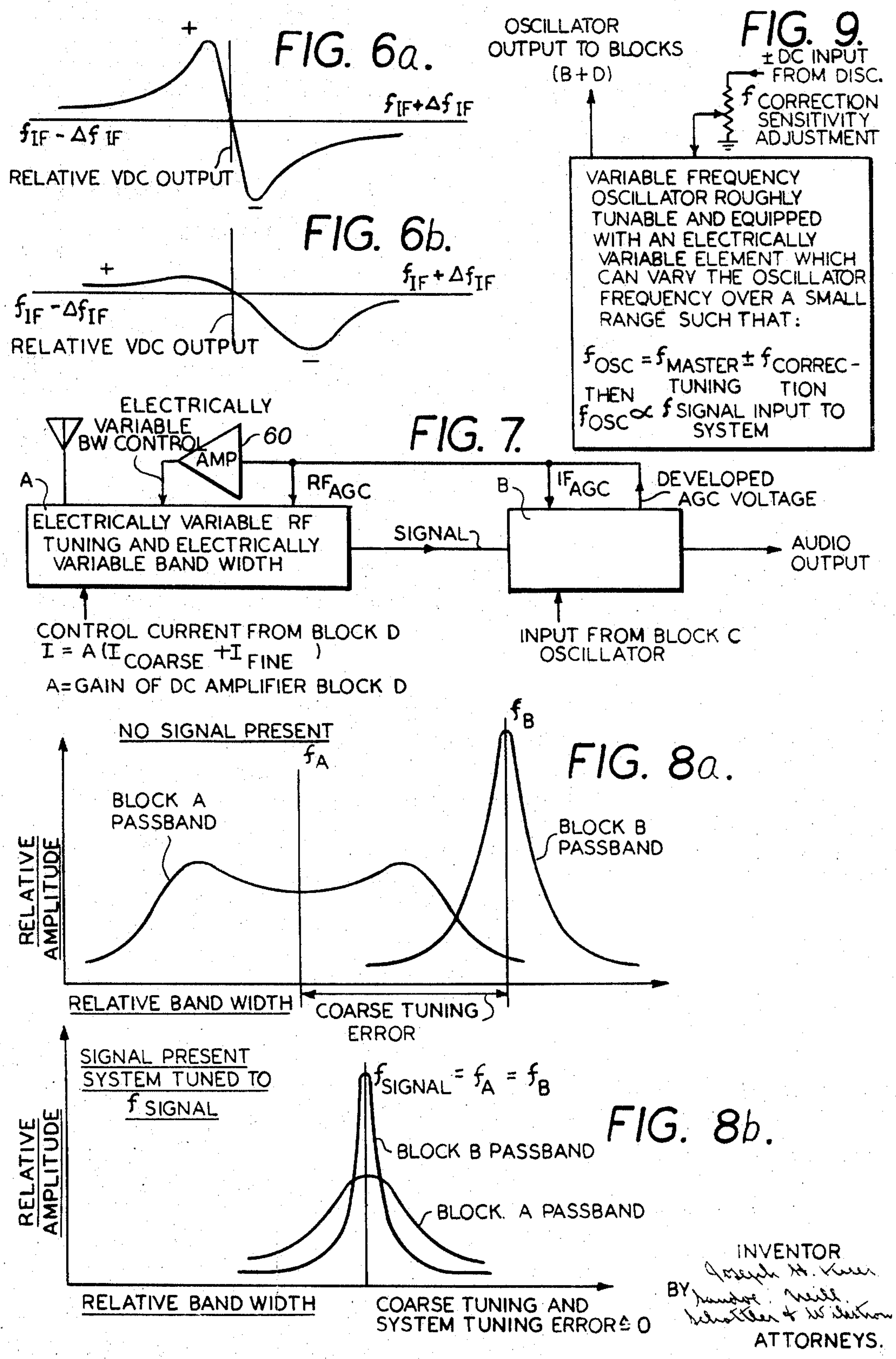
FIGURE 7 is a block diagram showing a modified construction for a portion of the system shown in FIGURE 1.
FIGURES 8*a* and 8*b* are graphs showing conditions in the circuit at different times during the tuning process.
FIGURE 9 is a block diagram showing a modification of another portion of the circuit shown in FIGURE 1.

As the oscillator 36 is tuned so that the Block (B) receiver passes slightly through the desired signal, the output of the IF amplifier of Block (B) becomes $f_{IF}+\Delta f_{IF}$ and the discriminator immediately supplies a negative correction current of large magnitude, as shown in FIGURE 6*b*. When this current has been summed with the current from the coarse tuning network of Block (D), the total current input to the DC amplifier 46 of Block (D) is $I=(I_{\text{coarse}}-I_{\text{fine}})$ whereupon after DC amplification in Block (D), the current $I_{\text{control}}=A(I_{\text{coarse}}-I_{\text{fine}})$ is applied to correct the tuning of the RF circuits of Block (A). When the circuits of Block (A) are dynamically ganged with Block (B), as described, the selectivity and gain of the system to the desired signal increases; and the discriminator 34 is supplied with more accurate frequency components based on improved system tuning, which in turn causes the instantaneous discriminator characteristic to approach the shape shown in FIGURE 6*a*, which, in turn, initiates another correction around the loop consisting of Blocks (B), (D) and (A), as just described.

A dynamic succession of these loop corrections occurs in a time limited only by the necessary time constants associated with the physical circuitry. The above process is a fast dynamic one and, therefore, it is not necessary to rock the oscillator tuning shaft to achieve tuning, as the system follows with negligible time lag the frequency to which the oscillator of Block (C), and therefore the receiver of Block (B), is tuned.

The other two conditions under which the system must perform are:

(3) Block (B) receiver tuned above the desired signal and Block (A) RF circuits coarse tuned above the desired signal.

(4) Block (B) receiver tuned above the desired signal and Block (A) RF circuits coarse tuned below the desired signal.

All of the mechanics of conditions (3) and (4) above have been covered by the basic discussion just previous. It is only necessary to note that the oscillator 34 of Block (C) and hence the receiver of Block (B), are now tuned downward toward the desired signal and the RF circuits of Block (A) are dynamically ganged to the Block (B) receiver, as in the previous discussion.

The degree of static accuracy to which the coarse tuning network must supply the required control signal to the tuned RF circuits of Block (A) is determined by the bandwidth of Block (A). It is necessary, for instance, that some energy from the receiving antenna 14 at the proper frequency pass through Block (A) and Block (B). This energy must be of sufficient magnitude to cause the discriminator 34 to develop a correction current when the desired signal is of the smallest magnitude which the system will be expected to receive. In the limit of this smallest signal to which the system is sensitive, i.e., will cause it to tune up can be noise either ambient or noise generated within the RF circuits themselves. This means that the Block (B) passband must fall within the passband of Block (A) at all times in order that the dynamic ganging process of which the system is capable may be consistently accomplished. Therefore, an improvement allowing an increase in the maximum allowable coarse tuning error (for whatever cause) could be accomplished, as shown in FIGURE 7.

In FIGURE 7 only Blocks (A) and (B) have been shown. However, the rest of the system is assumed to be as in FIGURE 1 and to be connected and working. The improvement mentioned is to modify the RF circuits of Block (A) to allow the bandwidth or passband width to be a function of a control signal which itself is a measure of the amount of signal frequency energy being received. In a standard superheterodyne circuit the automatic gain control voltage is such a measure and can be used for this purpose.

The only requirement of this modification (FIGURE 7) is that the AGC voltage available for control, from the reception of the weakest signal to be handled by the entire system, be of sufficient magnitude (possibly with further amplification through an additional amplifier 60, as shown) to reduce the band width of the electrically tuned RF stages of Block (A) to their minimum possible value. Implicit in this is the fact that under 0 signal conditions the bandwidth of Block (A) is a maximum. This process is shown in FIGURES 8*a* and 8*b* by an instantaneous look at the Block (A) and Block (B) bandwidths with and without a signal passing through the system and the corse tuning network error at random, and with fine tuning correction developed respectively.

It is understood that the electrically variable bandwidth feature of Block (A) may be accomplished in any number of ways, such as an electrically variable impedance or resistance hooked across the various tuned circuits to lower the Q factor, or an electrically variable impedance used to vary the coupling of two or more tuned circuits to each other and/or to their inputs or loads, or electrically staggering the tuning, or any combination of the above. Any of these schemes used with the coarse tuning network as previously described or used alone or in combination to perform the coarse tuning function are within this invention.

A further modification of the invention involves the stability of the local or tunable oscillator 36 of Block (C). Since the stability of this oscillator essentially determines the system tuning stability, a further improvement of the system is to equip this oscillator with the ability to be slightly tunable with an electric signal. The oscillator, of course, can be entirely electrically tunable to facilitate remoteness and this discussion would apply equally well as concerns its stability as it, in turn, contributes to system stability.

The basic idea of this improvement would be to provide automatic frequency control for the oscillator as a function of the discriminator DC error, as developed from the basic system previously discussed. This modification is illustrated in FIGURE 9.

Assuming that the Block (C) oscillator can be electrically tuned over only a small range, then effective automatic frequency control occurs only near perfect tuning. Then small oscillator drifts will cause small errors at the discriminator which will automatically retune the oscillator. Therefore, within practical limits the frequency stability of the system will depend solely on the frequency stability of the incoming signal. This improvement can be applied to the system in FIGURE 1 and to other embodiments of the invention.

GENERAL REMARKS

The invention thus far described has dealt solely with an AM superheterodyne receiving system. This was done to facilitate explanation. However, the invention is useful and applies to any of the superheterodyne type of receiving systems. For example, an FM superheterodyne receiving system also embodies all of the principles of the invention set forth. In fact, this invention could be used to good advantage in an FM system, since the required discriminator function of Block (B) (FIGURE 1) is already included as a standard part of such a receiving system.

The terms "receiving system" or "system" so far used indicate a receiver which utilizes the invention as described. The term "receiver" or "radio receiver" might equally well describe the full embodiment of the invented system.

Figure 2:
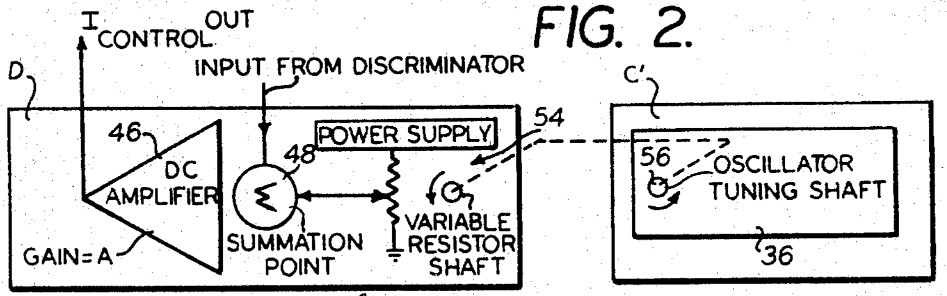
FIGURE 2 is a block diagram, similar to FIGURE 1, but showing a modification of a part of the receiver of FIGURE 1.

An important advantage of the basic invention illustrated in FIGURE 1 is that the Blocks (A), (B), (C) and (D), which comprise the basic system, are in no way bound or required to be in close proximity to one another. For example, this feature of the invention could be used to advantage in an aircraft receiver. In such an application it would be desired to locate the Block (A) RF units at the antenna to eliminate RF cable losses, while Blocks (B) and (D) might well be located in an area of maximum storage space readily accessible for servicing.

The Block (C) tuner oscillator might well be equipped with a calibrated dial and being small, could be located for easy access to the pilot or radioman. Further, several Block (C) oscillators could be used in several remote positions in the aircraft, cabled together, then using one tuner at a time, the one turned on or in use would be the receiver tuner. Further, a system of cabled jack positions would allow personnel to carry such tuners around the aircraft and plug in to tune the receiver from any jacked position. Any number of physical combinations or arrangements of the blocks of FIGURE 1 can be used since the connections or cabling between them are at low RF or DC impedance levels.

A final advantage of the invention as described, is that a receiving system using this invention will perform all of the functions of a mechanically tuned system. Further, since the degree of misganging or mistuning is a function of small electrical errors, performance exceeding that of a mechanically ganged system is easily attainable. Further, the basic cost of the system is mainly involved in the components of Blocks (B) and (D) and, therefore, with this system there is little cause to compromise on the number of tuned RF circuits desirable in Block (A) to attain desired receiver performance.

The preferred embodiment and some modifications of the invention have been illustrated and described, but other changes and modifications can be made and some features can be used in different combinations without departing from the invention as defined in the claims.

What is claimed is:

1. A superheterodyne receiver for radio frequency signals comprising a plurality of similar radio frequency stages and a mixer input to which signals are supplied by said stages, an electrically variable reactance in each of said stages, the electrically variable reactances being of similar electrical characteristics, a mixer to which signals are supplied from the radio frequency stages, a variable frequency oscillator connected to the mixer, a discriminator to which signals are supplied from the output of the mixer, a comparator, means for supplying current to the comparator proportional to the frequency of the oscillator, means for also supplying current to the comparator from the discriminator, both of said currents being summed in said comparator, and connecting circuits through which the summed currents are supplied equally to the electrically variable reactances of the radio frequency stages.

2. The receiver described in claim 1 characterized by a coarse tuning network between the oscillator and the comparator including means for delivering a direct current output current proportional to the frequency of the input current, the characteristics of the coarse tuning network being correlated with the variable reactances and their preselector stages proportionately to changes in the frequency of the oscillator.

3. The receiver described in claim 2 characterized by the receiver being a radio receiver, an antenna, the radio frequency stages including an antenna tuning stage with an electrically variable reactance to which the summed currents are supplied, an intermediate frequency amplifier between the mixer and the discriminator, and a limiter between the intermediate frequency amplifier and the discriminator.

4. The receiver described in claim 1 characterized by the discriminator comprising a network from which the output is a positive on negative direct current proportional to the difference in the frequency of the signal input to the discriminator and the center frequency to which the discriminator network is tuned, the discriminator being independent of signal amplitude and amplitude variations whereby the output of the discriminator is nulled when the entering signal is at the frequency of the discriminator network.

5. The receiver described in claim 1 characterized by the discriminator having a limiter at the input side, a high gain receiver ahead of the discriminator and which acts as a filter to pass only frequences corresponding approximately to $f_{IF}$ whereby the discriminator is insensitive to signals above and below the desired system input signal, and where $f_{IF}$ is the intermediate frequency from the mixer.

6. The receiver described in claim 1 characterized by an antenna, the preselected stages including an antenna tuning stage with an electrically variable reactance to which the summed currents are supplied, the preselector stages being located close to a lead in from the antenna and the variable frequency oscillator being located remote from the preselector stages and being free of any mechanical connections with any parts of the preselector stages.

7. The receiver described in claim 1 characterized by the receiver being a radio receiver, an antenna, the preselector stages including an antenna tuning stage with an electrically variable reactance to which the summed currents are supplied, and all of the other parts of the receiver being located remote from the tuned radio-frequency stages, and electrical conductors constituting the only connections between the radio-frequency stages and the other parts of the receiver.

8. The receiver described in claim 1 characterized by means for changing the frequency of the oscillator, a power supply, a variable resistor through which current from said power supply flows to the comparator, and a mechanical connection between the variable resistor and the means for changing the frequency of the oscillator to change the flow of current from said power supply to the comparator in proportion of the changes in the position of the means for changing the frequency of the oscillator.

References Cited

UNITED STATES PATENTS 3,382,441 5/1968 Hunter ______________ 325—422
2,869,080 1/1959 Bycer _____________ 325—422 X KATHLEEN H. CLAFFY, Primary Examiner D. L. RAY, Assistant Examiner